(12) United States Patent
Takagi

(10) Patent No.: US 6,676,759 B1
(45) Date of Patent: Jan. 13, 2004

(54) WAFER SUPPORT DEVICE IN SEMICONDUCTOR MANUFACTURING DEVICE

(75) Inventor: Yoji Takagi, Narita (JP)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/830,613

(22) PCT Filed: Oct. 29, 1999

(86) PCT No.: PCT/JP99/06043

§ 371 (c)(1), (2), (4) Date: Apr. 30, 2001

(87) PCT Pub. No.: WO00/26961

PCT Pub. Date: May 11, 2000

(30) Foreign Application Priority Data

Oct. 30, 1998 (JP) .......................................... P10-310675

(51) Int. Cl.[7] .......................... H01L 21/326; C23C 16/00
(52) U.S. Cl. .................. 118/728; 118/500; 156/345.51; 156/345.52
(58) Field of Search ................................ 118/728, 500; 156/345.51, 345.52

(56) References Cited

U.S. PATENT DOCUMENTS 4,872,947 A * 10/1989 Wang et al. .................. 216/38
5,061,144 A * 10/1991 Akimoto et al. ........ 414/222.02
5,643,366 A    7/1997 Somekh et al.
6,167,834 B1 * 1/2001 Wang et al. ............. 118/723 E

FOREIGN PATENT DOCUMENTS

| JP | 2-95244 | 7/1990 | |
| JP | 3-101247 | 4/1991 | |
| JP | 03101247 A | * 4/1991 | ........... H01L/21/68 |
| JP | 5-343506 | 12/1993 | |
| JP | 05343506 A | * 12/1993 | ........... H01L/21/68 |
| JP | 7-297262 | 11/1995 | |
| JP | 09162258 A | * 6/1997 | ........... H01L/21/68 |

* cited by examiner

Primary Examiner—Gregory Mills
Assistant Examiner—Ram N Kackar
(74) Attorney, Agent, or Firm—Moser, Patterson & Sheridan L.L.P.

(57) ABSTRACT

A wafer support apparatus (14) of the present invention comprises a wafer support body (22) having a support area (26) for supporting a wafer W, in an upper surface thereof; and a plurality of lift members (36), each extending from the outside of the support area to the inside of the support area of the wafer support body, having a slope surface sloping downward toward the inside, in an upper surface, and being vertically movable between a lower position and an upper position with respect to the upper surface of the wafer support body.

5 Claims, 5 Drawing Sheets

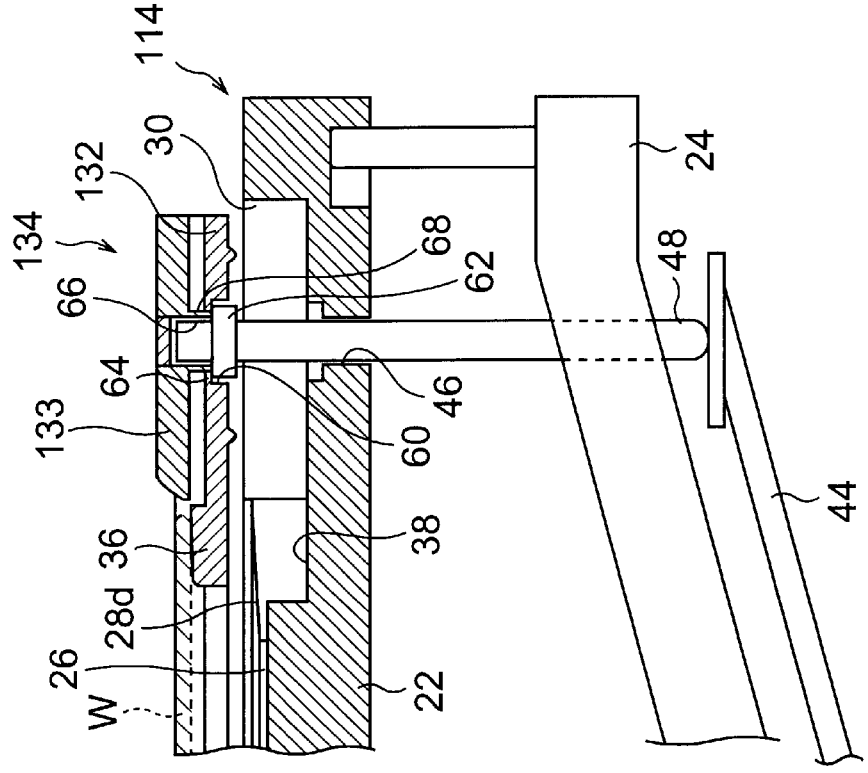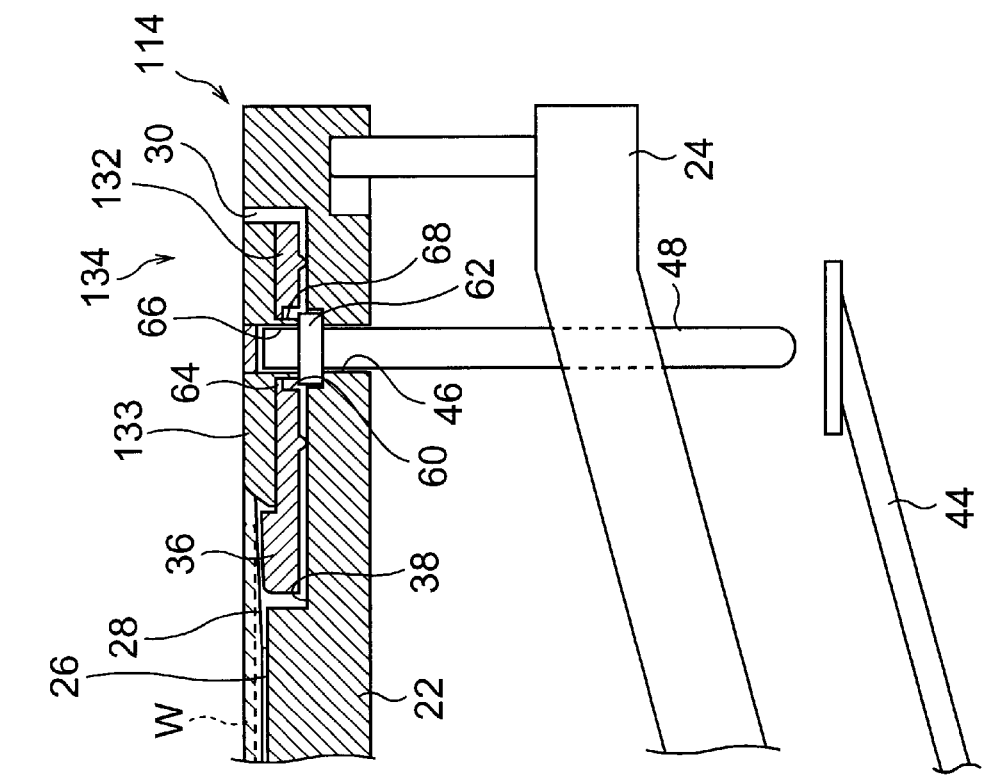

WAFER SUPPORT DEVICE IN SEMICONDUCTOR MANUFACTURING DEVICE

TECHNICAL FIELD

The present invention relates to wafer support apparatus in semiconductor fabrication device and, more particularly, to means for vertically moving a wafer, provided in wafer support apparatus.

BACKGROUND ART

There is semiconductor fabrication device of a single wafer type for processing a single silicon wafer at a time. In the semiconductor fabrication device of this single wafer type, a wafer support apparatus for supporting only one wafer in a horizontal posture is normally provided in a process chamber.

The ordinary wafer support apparatus is basically constructed of a wafer support body, so called a susceptor, on which a wafer is mounted. The wafer support apparatus is also provided with a lift mechanism for vertically moving the wafer relative to the susceptor. A conventional, ordinary lift mechanism has a plurality of lift pins extending through the susceptor and a wafer is mounted on the upper ends of these lift pins. Thus the wafer can be moved up and down by vertically moving the lift pins. The lift mechanism of this type permits a wafer carried on a blade of a carry robot to be transferred onto the susceptor or, inversely, it permits the wafer to be brought from the susceptor to the carry robot.

DISCLOSER OF THE INVENTION

In the conventional wafer support apparatus as described above, the lift pins are located at the position below the upper surface of the susceptor during supporting periods of wafer. Therefore, when the lift pins are moved up in order to lift the wafer from the susceptor, the upper ends of the lift pins hit the back surface of the wafer and sometimes damage the contact portions. Such damage on the back surface of wafer might cause a negative effect in postprocesses.

In addition, since the back surface of the wafer is supported by only the upper ends of the lift pins during vertical motion of the wafer, the wafer readily undergoes positional deviation and can deviate from the support area of the susceptor when brought down onto the susceptor.

The present invention has been accomplished under such circumstances and an object of the present invention is to provide wafer support apparatus having a lift mechanism capable of preventing the damage of the back surface of the wafer and the positional deviation of the wafer.

In order to accomplish the above object, the present invention provides a wafer support apparatus comprising a wafer support body having a support area for supporting a wafer, in an upper surface thereof; and a plurality of lift members, each extending from the outside to the inside of the support area of the wafer support body, having a slope surface sloping downward toward the inside, in an upper surface, and being vertically movable between a lower position and an upper position with respect to the upper surface of the wafer support body.

The lift members replace the conventional lift pins. They do not touch the back surface of the wafer but touch only the lower edge in the periphery of the wafer, because of the setting positions of the lift members and the slope surfaces of the upper surfaces thereof. Therefore, the back surface of wafer can be prevented from being damaged. Since the upper surfaces of the lift members increase their height with distance from the center, it is also feasible to suppress the positional deviation in the horizontal direction.

The lift members are preferably formed integrally with an internal peripheral edge of a lift ring of an arcuate shape disposed outside the support area.

In an effective configuration, the lift ring is provided with claw members kept in a vertically movable state and at respective positions adjacent to the lift members and the claw members are arranged to be separated and lifted from the lift ring when the lift ring is located at an up position. In this configuration, the claw members located at the position higher than the wafer can prevent the wafer supported by the lift members, from moving horizontally.

Further, a cross-sectional shape of the upper surfaces of the lift members along the circumferential direction of the support area is preferably an upwardly convex curve. This permits the lift members to be brought into point contact with the wafer.

BRIEF DESCRIPTION OF THE DRAWINGS

FIG. 6A is a diagram to show a second embodiment of the wafer support apparatus according to the present invention, which shows a support state of a wafer on the susceptor.

FIG. 6B is a diagram to show the second embodiment of the wafer support apparatus according to the present invention, which shows an up state of the wafer above the susceptor.

BEST MODE FOR CARRYING OUT THE INVENTION

The preferred embodiments of the present invention will be described hereinafter in detail with reference to the accompanying drawings.

Figure 1:
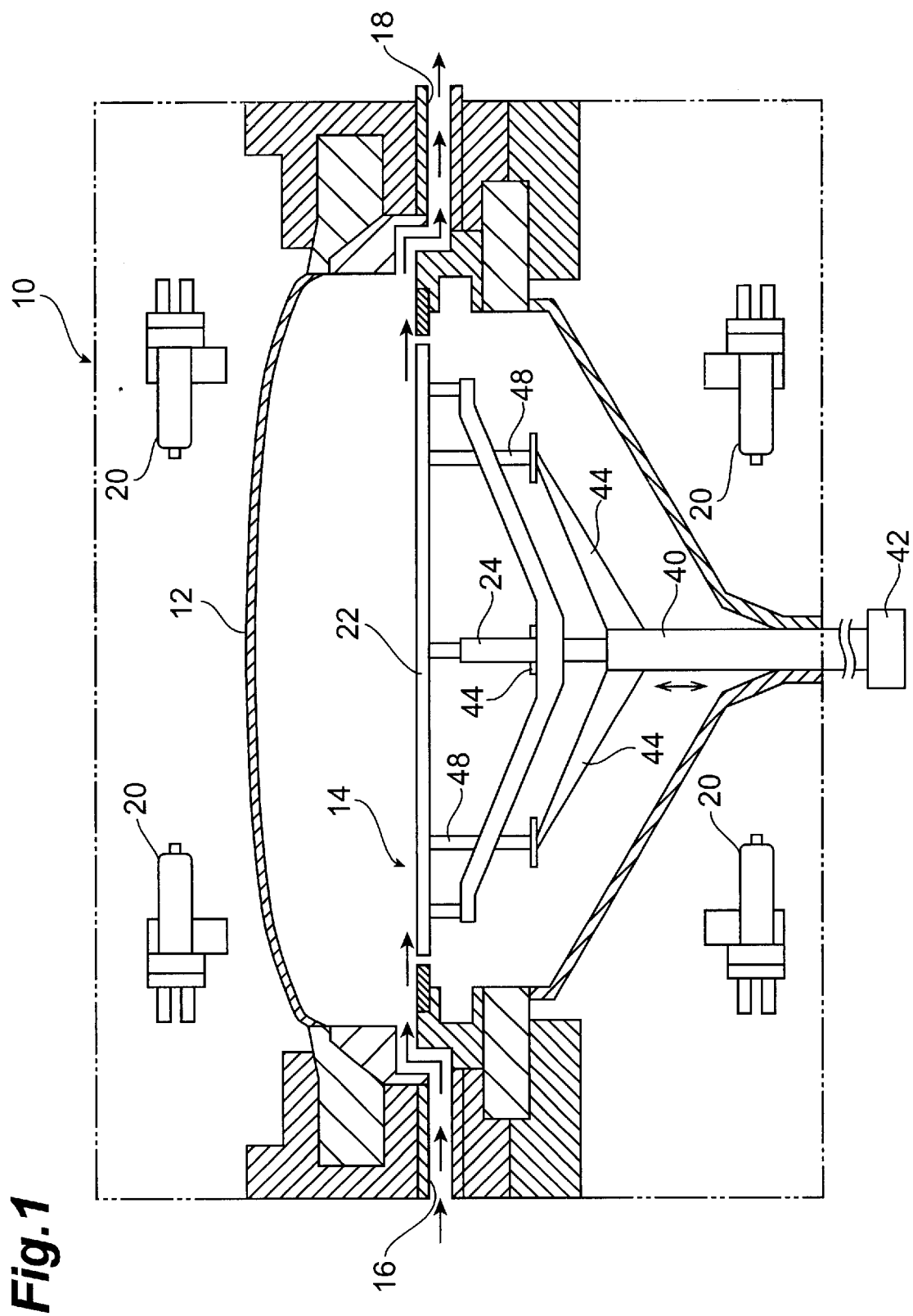
FIG. 1 is an explanatory diagram to schematically show an epitaxial growth system to which the wafer support apparatus of the present invention can be applied.

FIG. 1 schematically shows a semiconductor fabrication system (epitaxial growth system) in which the wafer support apparatus according to the present invention can be installed. The epitaxial growth system 10 illustrated is of the single wafer type for processing one silicon wafer (not illustrated in FIG. 1) at a time and is provided with a process chamber 12 made of silica glass. The wafer support apparatus 14 is disposed in this process chamber 12. In the side part of the process chamber 12 an inlet port 16 of process gas is formed and an exhaust port 18 is formed at a position opposite it.

A plurality of halogen lamps 20 are radially arranged in each of an upper region and a lower region of the process chamber 12.

In the epitaxial growth system 10 of the above structure, a wafer is supported by the wafer support apparatus 14, thereafter the halogen lamps 20 are lighted up to heat the wafer, and the process gas such as trichlorosilane ($SiHCl_3$) gas, dichlorosilane ($SiH_2Cl_2$) gas, or the like is guided through the inlet port 16 into the chamber while evacuating the interior through the exhaust port 18. Then the process gas flows in a laminar flow state along the surface of the wafer heated at predetermined temperature, whereby a single crystal of silicon is epitaxially grown on the wafer.

Figure 2:
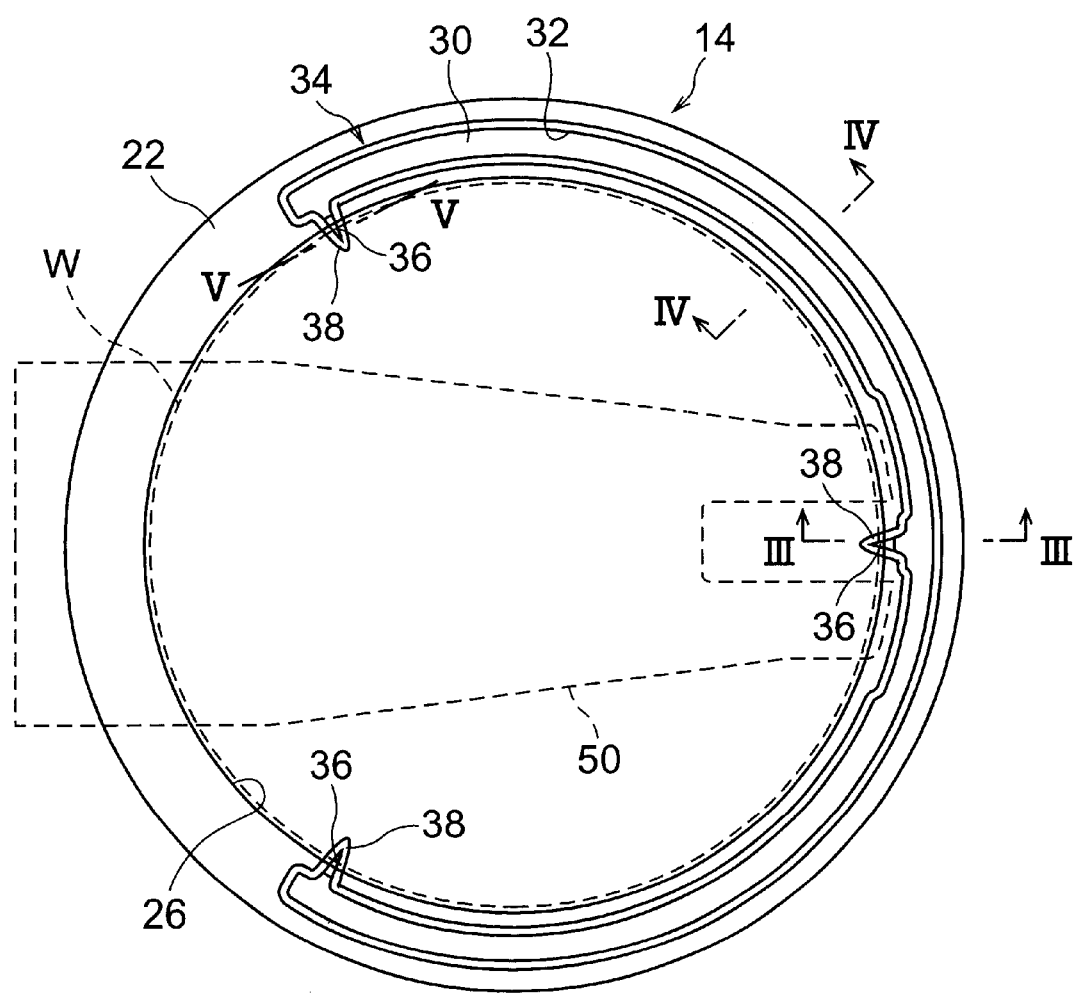
FIG. 2 is a plan view to show a first embodiment of the wafer support apparatus according to the present invention.
Figure 3A:
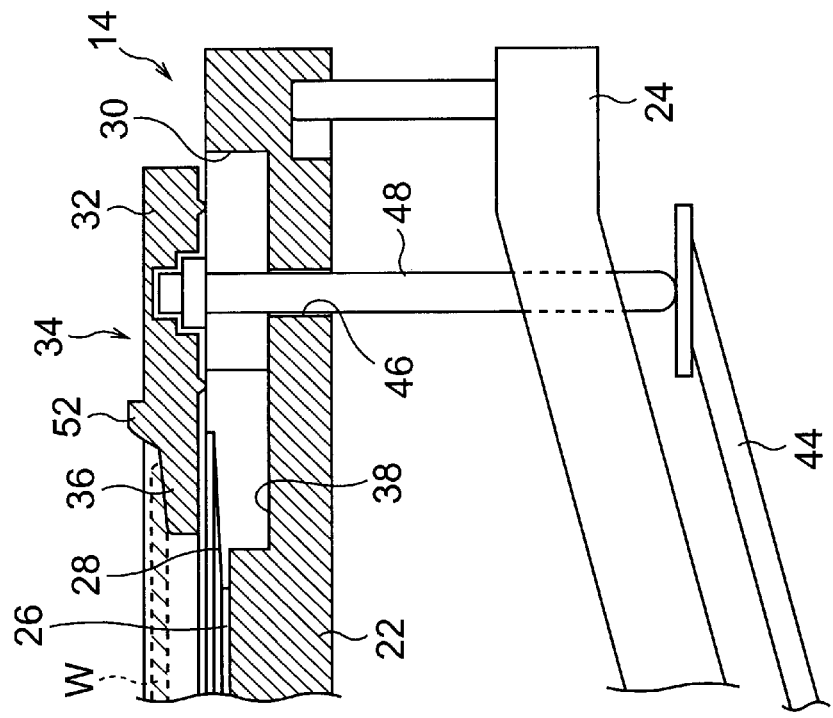
FIG. 3A is a cross-sectional view along a line III—III of the wafer support apparatus illustrated in FIG. 2, which shows a support state of a wafer on the susceptor.
Figure 3B:
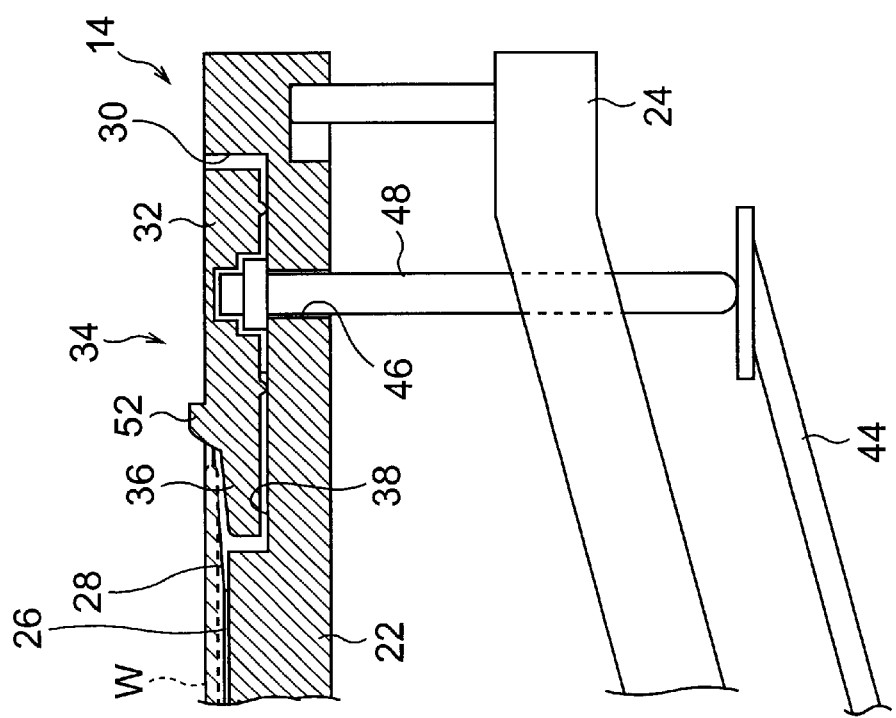
FIG. 3B is a cross-sectional view along the line III—III of the wafer support apparatus illustrated in FIG. 2, which shows an up state of the wafer above the susceptor.
Figure 4:
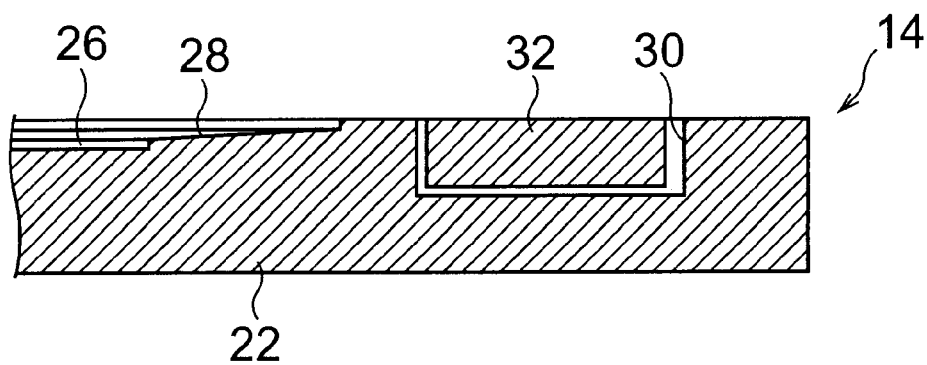
FIG. 4 is a cross-sectional view along a line IV—IV of the wafer support apparatus illustrated in FIG. 2.

In this epitaxial system 10, the wafer support apparatus 14 of the first embodiment of the present invention is provided with a susceptor 22 being a wafer support body as illustrated in FIG. 2 to FIG. 4. The susceptor 22 is made of a graphite material coated with silicon carbide and in a disk shape, and is horizontally supported at three points from the back by support shafts 24 of silica glass standing in the lower region of the process chamber 12. The susceptor 22 has a circular recess 26 in the upper surface thereof. This recess 26 is a support area to accommodate and support a wafer W. A slope surface 28 sloping downward toward the center is formed in the peripheral part of the bottom surface of the recess 26. Therefore, when the wafer W is placed at the predetermined position in the recess 26 of the susceptor 22, the wafer W is supported in a state in which the peripheral lower edge (corner) of the wafer W is in contact with the slope surface 28 in the periphery of the recess 26 (see FIG. 3A). In this support state, the upper surface of the wafer W is approximately aligned with the upper surface of the peripheral part of the susceptor outside the recess 26. This is for allowing the process gas from the inlet 16 to flow in the laminar flow state.

In the peripheral part of the susceptor 22, a groove 30 of substantially arcuate shape (C-shape) is formed in a concentric state with the susceptor 22 (see FIG. 2). The angle of the arc of this groove 30 is preferably about 250°. A lift ring 32 of an arcuate shape or C-shape approximately identical to that of the groove 30 is placed in the groove 30.

The lift ring 32 composes a lift mechanism 34 for vertically moving the wafer W relative to the susceptor 22. For the same reason as described above, the dimensions are determined so that the upper surface of the lift ring 32 and the upper surface of the peripheral part of the susceptor 22 are aligned with each other, as illustrated in FIG. 3A, in the state in which the lift ring 32 is accommodated in the groove 30. As illustrated in FIG. 2, three lift members 36 project integrally with the internal peripheral edge of the lift ring 32. The three lift members 36 are preferably arranged at intervals of about 120°. As illustrated in the same figure, each lift member 36 projects inward (toward the center of the susceptor 22) and the tip thereof reaches the inside area of the recess 26. Depressions 38 of substantially the same shape as the lift members 36 are formed in portions of the susceptor 22 corresponding to the lift members 36, whereby the lift ring 32 can be accommodated in the groove 30 without any hindrance.

The upper surfaces of the lift members 36 are a step lower than the upper surface of the lift ring 32 and are located below the bottom surface of the recess 26 or at least below the slope surface 28 of the peripheral part in the accommodated state of the lift ring 32 in the groove 30. Accordingly, the wafer W is kept off the lift members 36 when the wafer W is supported on the susceptor 22.

The upper surfaces of the lift members 36 slope downward toward the center of the susceptor 22. Further, as also seen from FIG. 5, the upper surfaces of the lift members 36 are curved surfaces being upwardly convex in the circumferential direction of the susceptor 22.

The lift ring 32 is arranged vertically movable by use of a means similar to conventional means. More specifically, the lift mechanism 34 of the first embodiment consists, as illustrated in FIG. 1, of a lift tube 40 arranged in a vertically movable state so as to surround the main axis of susceptor support shaft 24, a drive unit 42 for vertically moving this lift tube 40, three lift arms 44 radially extending from the lift tube 40, and lift pins 48 suspended through respective through holes 46, which are bored through the susceptor 22 from the bottom surface of the groove 30 thereof (see FIG. 3A), and is constructed so that the drive unit 42 is controlled to raise the lift tube 40 and the lift arms 44 to lift the lift pins 48 by the distal ends of the lift arms 44, thereby moving the lift ring 32 up.

Figure 5:
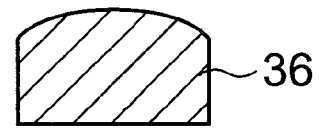
FIG. 5 is a cross-sectional view along a line V—V of the wafer support apparatus illustrated in FIG. 2.

For supporting a wafer W on the wafer support apparatus 14 of this structure, a carry robot is first actuated to locate the wafer W mounted on a blade 50 of the carry robot, at the position immediately above the recess 26 of the susceptor 22. Then the lift ring 32 is moved up by controlling the drive unit 42 of the lift mechanism 34. At this time, the blade 50 of the carry robot is located in the opening part of the lift ring 32 (see FIG. 2), and thus it does not interfere with the upward motion of the lift ring 32. When the lift ring 32 reaches a position higher than the blade 50, the wafer W is transferred from the blade 50 onto the lift members 36 of the lift ring 32, whereby the wafer W is supported at three points (see FIG. 3B). Since the upper surfaces of the lift members 36 slope downward toward the inside as described previously, the lift members 36 are in contact with the wafer W only in the portions at the lower edge of the periphery of the wafer W. For this reason, the back surface of the wafer W is kept from being damaged. Even with the wafer support apparatus of the present embodiment, the possibility of damaging the lower edge of the periphery of the wafer W is not zero, but the damage in this part will raise no significant problem. The slopes of the lift members 36 also function to suppress horizontal movement of the wafer W. Since the upper surface of each lift member 36 is curved in the convex shape as illustrated in FIG. 5, it touches the wafer W at only one point. Since there is the step formed between the lift members 36 and the lift ring 32, the positional deviation of the wafer W is also prevented thereby. However, the wafer W can possibly ride over the step for some reason, and it is thus preferable to provide a projection as indicated by numeral 52 in FIG. 3A.

After the wafer W is supported by the lift members 36 of the lift ring 32, the blade 50 of the carry robot is moved from above the susceptor 22 to the outside of the process chamber 12, and then the lift ring 32 is moved down. When the lift ring 32 is set perfectly in the groove 30, the lift members 36 are located below the slope surface 28 of the recess 26 of the susceptor 22, as illustrated in FIG. 3A, and the wafer W is supported by the slope surface 28 of the recess 26. After this, the epitaxial growth process described above is carried out.

It is readily understood that the lift mechanism 34 and the transfer robot are operated according to the reverse procedures to the above, for lifting the wafer W from the susceptor 22 and transferring the wafer onto the blade 50 of the carry robot.

FIG. 6A and FIG. 6B depict the second embodiment of the wafer support apparatus according to the present invention. In the second embodiment, like or equivalent portions to those in the first embodiment will be denoted by the same reference symbols and the detailed description thereof will be omitted. In the wafer support apparatus 114 of the second embodiment the lift mechanism 134 is provided with three claw members 133 on the C-shaped lift ring 132. Recesses for receiving the claw members 133 are formed in portions of the lift ring 132 where the claw members 133 are located. In a state in which the claw members 133 are fitted in the corresponding recesses (FIG. 6A), they are of the substantially same shape as the lift ring 32 of the first embodiment. The claw members 133 are located at positions adjacent to the lift members 36. Therefore, the number of claw members 133 is three, which is equal to the number of lift members 36.

Through holes 60 are formed at contact positions with the upper ends of the lift pins 48, in the lift ring 132. Each through hole 60 accepts a collar 62 formed at the upper end of the corresponding lift pin 48 and is provided with an inward flange 64 so as to be able to be lifted by the lift pin 48.

On the other hand, a counterbore 66 is formed at the corresponding position in each claw member 133. The inside diameter of the counterbores 66 is substantially equal to the outer diameter of the upper ends of the lift pins 48. Further, a cylindrical projection 68 is formed in the part of the lower surface surrounding each counterbore 66. The cylindrical projections 68 are fitted in the corresponding through holes 60 of the lift ring 132 when the claw members 133 are placed on the lift ring 132.

In this structure, with the lift pins 48 at the down position, as illustrated in FIG. 6A, the claw members 133 are laid on the lift ring 132, which is substantially the same state as that in FIG. 3A. With upward motion of the lift pins 48, the cylindrical projections 68 of the claw members 133 are first pushed up by the collars 62 of the lift pins 48. This raises only the claw members 133 to separate them from the lift ring 132. In this state, the step becomes greater between the upper surfaces of the lift members 36 and the upper surfaces of the claw members 133, thereby enhancing the effect of preventing the horizontal movement of the wafer W. Therefore, there is no need for provision of the projections 52 as illustrated in FIGS. 3A and 3B. With further upward motion of the lift pins, the collars 62 of the lift pins 48 go into contact with the lower surfaces of the flanges 64 of the through holes 60, and the claw members 133 and the lift ring 132 start moving integrally up. The action except for the above is the same as in the first embodiment.

The above described the preferred embodiments of the present invention, but it is needless to mention that the present invention is not limited to the above embodiments. For example, the semiconductor fabrication device of the above embodiments was the epitaxial growth system, but the present invention can also be applied to systems for carrying out other processing, for example, CVD systems or the like. In addition, the lift members do not always have to be formed in the C-shaped lift ring, but it is also contemplated that the lift members are provided directly at the upper ends of the respective lift pins 48, for example.

Industrial Applicability

As described above, according to the present invention the wafer is supported by the wafer support body such as the susceptor or the like, or, for lifting the wafer from the wafer support body in the inverse case, the wafer is vertically moved in the support state only at the lower peripheral edge thereof, whereby the back surface of the wafer is prevented from being damaged. Since the upper surfaces of the lift members are the slope surfaces increasing their height with distance from the center, the positional deviation can be prevented in the horizontal direction of the wafer and the wafer can be placed and supported with accuracy at the predetermined position on the wafer support body.

What is claimed is:

1. A wafer support apparatus comprising:

a wafer support body disposed in a process chamber of a semiconductor fabrication device and having a support area for supporting a wafer, in an upper surface thereof; and a plurality of lift members, each extending from the outside to the inside of said support area of the wafer support body, having a slope surface sloping downward toward the inside, in an upper surface, and being vertically movable between a lower position and an upper position with respect to said upper surface of said wafer support body, wherein said lift members are formed integrally with an inner peripheral edge of a lift ring of an arcuate shape placed outside said support area, wherein said lift ring comprises claw members placed in a vertically movable state and at respective positions adjacent to said lift members, and wherein when said lift ring is located at an up position, said claw members are arranged to be separated and lifted from said lift ring.

2. The wafer support apparatus according to claim 1, wherein a cross-sectional shape of the upper surfaces of said lift members along a circumferential direction of said support area is an upwardly convex curve.

3. The wafer support apparatus according to claim 1, wherein a groove of an arcuate shape is formed in said wafer support body, and wherein said lift ring can be accommodated in said groove.

4. The wafer support apparatus according to claim 3, wherein an angle of the arcuate shape of said groove is approximately 250°.

5. The wafer support apparatus according to claim 1, wherein said lift members are three lift members arranged at intervals of about 120°.

* * * * *